(12) United States Patent
Chua et al.

(10) Patent No.: US 11,908,782 B2
(45) Date of Patent: Feb. 20, 2024

(54) SPACERS FORMED ON A SUBSTRATE WITH ETCHED MICRO-SPRINGS

(71) Applicant: Palo Alto Research Center Incorporated, Palo Alto, CA (US)

(72) Inventors: Christopher L. Chua, San Jose, CA (US); Qian Wang, Mountain View, CA (US); Yu Wang, Union City, CA (US); Eugene M. Chow, Palo Alto, CA (US)

(73) Assignee: XEROX CORPORATION, Norwalk, CT (US)

( * ) Notice: Subject to any disclaimer, the term of this patent is extended or adjusted under 35 U.S.C. 154(b) by 248 days.

(21) Appl. No.: 17/208,332

(22) Filed: Mar. 22, 2021

(65) Prior Publication Data

US 2022/0301996 A1    Sep. 22, 2022

(51) Int. Cl.
  *H01L 23/498* (2006.01)
  *H01L 23/00* (2006.01)
  *H01L 23/31* (2006.01)

(52) U.S. Cl.
  CPC .... *H01L 23/49811* (2013.01); *H01L 23/3157* (2013.01); *H01L 24/66* (2013.01)

(58) Field of Classification Search
  CPC . H01L 2224/72; H01L 24/90; H01L 2224/64; H01L 23/49811; H01L 23/3157; H01L 24/66; H01L 24/32; H01L 2224/0401; H01L 2224/05568; H01L 2224/05666; H01L 2224/13144; H01L 2224/1357; H01L 2224/14154; H01L 24/11; H01L 24/81; H01L 2224/11005; H01L 2224/11015; H01L 2224/114; H01L 2224/13016; H01L 2224/13171; H01L 2224/14131; H01L 2224/2612; H01L 2224/29035; H01L 2224/32057; H01L 24/13; H01L 2224/10135; H01L 2224/11614; H01L 2224/11901; H01L 2224/13083; H01L 2224/1318; H01L 2224/13566; H01L 2224/13644; H01L 2224/14152; H01L 2224/16145; H01L 2224/2919; H01L 2224/73203; H01L 2224/81139; H01L 2224/83104; H01L 2224/83855; H01L 2224/92125; H01L 24/72; H01L 21/563; H01L 2224/32145; H01L 2224/81903
  See application file for complete search history.

(56) References Cited

U.S. PATENT DOCUMENTS

5,693,983 A     12/1997  Ho et al.
7,349,223 B2    3/2008   Haemer et al.
(Continued)

*Primary Examiner* — Bitew A Dinke
(74) *Attorney, Agent, or Firm* — Mueting Raasch Group (57) ABSTRACT

An electronic assembly and methods of making the assembly are disclosed. The electronic assembly includes a substrate with an elastic member having an intrinsic stress profile. The elastic member has an anchor portion on the surface of the substrate; and a free end biased away from the substrate via the intrinsic stress profile to form an out of plane structure. The substrate includes one or more spacers on the substrate. The electronic assembly includes a chip comprising contact pads. The out of plane structure on the substrate touches corresponding contact pads on the chip, and the spacers on the substrate touch the chip forming a gap between the substrate and the chip.

17 Claims, 7 Drawing Sheets

(56) References Cited

U.S. PATENT DOCUMENTS

| | | | |
|---|---|---|---|
| 7,458,816 B1* | 12/2008 | Mathieu | G01R 1/07357 |
| | | | 439/66 |
| 7,629,194 B1* | 12/2009 | Schaffner | H01H 59/0009 |
| | | | 438/52 |
| 7,713,388 B2 | 5/2010 | Chua et al. | |
| 8,022,599 B2* | 9/2011 | Kawakubo | B81B 3/0008 |
| | | | 310/330 |
| 8,530,276 B2 | 9/2013 | Hilt et al. | |
| 8,614,514 B1* | 12/2013 | Powers | H01L 21/4853 |
| | | | 257/784 |
| 8,686,552 B1* | 4/2014 | Chow | H01L 25/50 |
| | | | 257/686 |
| 9,955,575 B1 | 4/2018 | Wang et al. | |
| 2003/0010615 A1* | 1/2003 | Fork | G01R 1/06727 |
| | | | 200/262 |
| 2003/0129866 A1* | 7/2003 | Romano | H01R 13/03 |
| | | | 439/81 |
| 2004/0038560 A1* | 2/2004 | Mathieu | H05K 3/326 |
| | | | 439/876 |
| 2005/0133362 A1 | 6/2005 | Van Schuylenbergh | |
| 2006/0030179 A1* | 2/2006 | Van Schuylenbergh | H01R 13/6477 |
| | | | 257/E23.078 |
| 2007/0023909 A1 | 2/2007 | Fork et al. | |
| 2007/0139899 A1* | 6/2007 | Van Schuylenbergh | H01L 23/36 |
| | | | 257/E23.101 |
| 2008/0251940 A1 | 10/2008 | Lee et al. | |
| 2009/0140433 A1* | 6/2009 | Bloom | B81C 3/008 |
| | | | 438/618 |
| 2010/0285700 A1 | 11/2010 | Chow et al. | |
| 2010/0295164 A1* | 11/2010 | Chua | H01L 21/563 |
| | | | 257/E23.06 |
| 2013/0154127 A1* | 6/2013 | Chow | H01L 24/11 |
| | | | 257/E23.06 |
| 2013/0196471 A1* | 8/2013 | Chua | H01L 24/29 |
| | | | 438/118 |
| 2014/0265848 A1* | 9/2014 | Cheng | H05H 1/24 |
| | | | 315/111.21 |
| 2016/0128206 A9 | 5/2016 | Chow | |
| 2016/0368765 A1* | 12/2016 | Atnip | B81B 3/0072 |
| 2019/0067779 A1* | 2/2019 | U-Yen | H01L 23/552 |
| 2021/0391525 A1* | 12/2021 | Chua | H10N 60/01 |

* cited by examiner

SPACERS FORMED ON A SUBSTRATE WITH ETCHED MICRO-SPRINGS

GOVERNMENT SUPPORT STATEMENT

This invention was made with government support under contract FA8702-15-D0001 awarded by the Department of Defense. The government has certain rights in the invention.

SUMMARY

The present disclosure is directed to spacers formed on a substrate with etched micro-springs. In one embodiment, a method involves depositing a release layer on a substrate and depositing an elastic metal on the release layer. The elastic metal has an intrinsic stress profile. The method involves etching through the layer of the elastic metal to form one or more elastic members and coating a spacer material onto the substrate. A spacer material is patterned to form one or more spacers at least partially surround the elastic members. The release layer is undercut etched to release a free end of the elastic member from the substrate while leaving an anchor portion of each of the elastic members fixed to the substrate. The intrinsic stress profile in the elastic member biases the free end of the elastic member away from the substrate to form an out of plane structure upon release of the free end.

In another embodiment, an electronic assembly includes a substrate with an elastic member having an intrinsic stress profile. The elastic member has an anchor portion on the surface of the substrate; and a free end biased away from the substrate via the intrinsic stress profile to form an out of plane structure. The substrate includes one or more spacers on the substrate. The electronic assembly includes a chip comprising contact pads. The out of plane structure on the substrate touches corresponding contact pads on the chip, and the spacers on the substrate touch the chip forming a gap between the substrate and the chip.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure is generally related to the fabrication of electrical devices that utilize integrated circuits (ICs). Integrated circuits are manufactured on a wafer that is divided into individual chips. In some packaging configurations, each chip is put into an enclosure where it is wire bonded to terminals that are located on an exterior of the enclosure. The terminals may be metal leads configured for thru-hole or surface mount. Integrated circuit packages of this type are typically assembled with other electronic components by being soldered to traces on a circuit board.

As devices have become smaller and ICs more complex, it has become difficult to achieve design targets for some device using conventional circuit board attachment of ICs. One mounting method employed to counter these disadvantages is known as flip-chip mounting. Flip-chip involves depositing conductive pads for the power and signal lines on the top surface of an IC, which is then flipped over to a mounting board that has corresponding pads on a mounting surface. A reflow operation is performed which bonds the IC to the board and establishes the electrical connections between the pads. The chip may have minimal or no enclosure, e.g., just having a coating or passivation layers to protect the chip layers from the environment.

Among the advantages of flip-chip assembly is the ability to form compact final assemblies with short signal lines, and adaptability to high-speed assembly processes. Flip-chip bonding has some disadvantages, though. Such assemblies are not well-suited for easy replacement, or unaided manual installation. The short connections formed by the bonded pads are very stiff, so if the thermal expansion of the chip is not well matched to the supporting board, the connections can fracture. Also, if the mounting surface of the board is not very flat, some connections may fail to bond due to insufficient contact between the pads.

In order to provide the advantages of flip-chip assembly and counter some of the disadvantages, a system has been developed to use non-soldered connections in a flip-chip style assembly. This involves forming conductive springs that extend out of the pads of a mounting surface and/or IC. This can result in a multi-chip module assembly that is compact with short conductor runs, yet can still be assembled and reworked more easily than a bonded assembly. The flexible springs are more forgiving of variation in surface flatness thus is less likely to experience mechanical stress if the mated devices have different rates of thermal expansion.

In order to fabricate springs at such a small scale, techniques have been developed to use wafer production processes to form these springs on wafer substrates. For example, U.S. Pat. No. 9,955,575, dated Apr. 24, 2018, describes methods for producing out of plane structures (e.g., coils) that can be used in microelectronic circuits. Generally, a film is deposited with stress engineered layers onto an electronic device. The film has elastic portions with a non-uniform stress profile through its thickness such that the stress engineered film curls upward when one end is released, e.g., via undercut etching the end while keeping another end of the film anchored.

Figure 1:
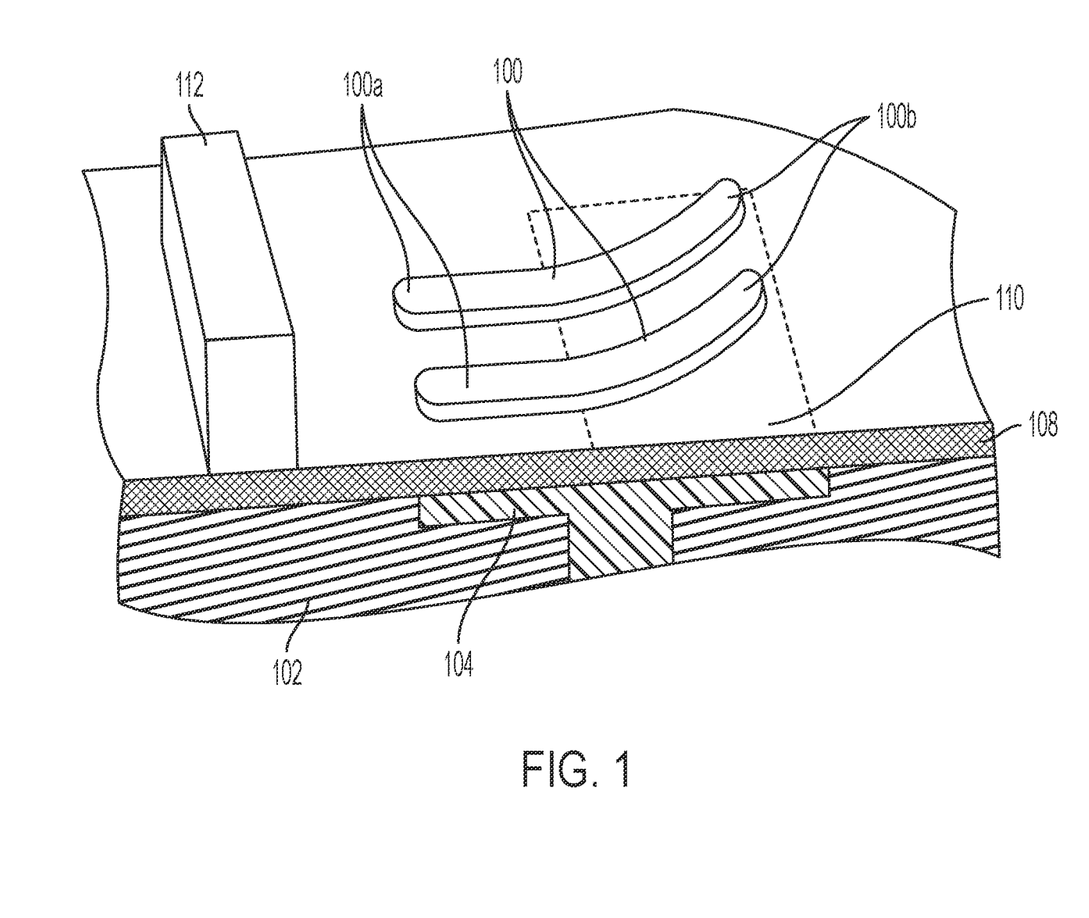
FIG. 1 is a perspective view of a micro-spring according to an example embodiment.

In FIG. 1, a cutaway view shows an example of microfabricated springs 100 according to an example embodiment. The micro-springs 100 (are also referred to herein as elastic members) are formed on a substrate 102. A metal contact 104 extends to the surface of the substrate, and is part of an electrical path that couples internal components of the substrate 102 (e.g., on-chip interconnects, circuitry) to another electrical device (e.g., an IC, etc.). The substrate 102 may have a large number of these metal contacts 104, e.g., arranged on a grid pattern on an outer surface of the substrate 102. In some embodiments, the substrate 102 includes superconducting circuits. Superconducting circuits contain electrical trace lines that have zero electrical resistance. Low temperature electronics are electronics designed to remain functional below 77 Kelvin (temperature at which nitrogen becomes liquid). Some materials achieve superconductivity at low temperatures.

When interfacing the substrate 102 with the other electrical device, a free end 100*b* of the spring 100 deflects when contacting a contact of the electrical device and forms an electrical path therebetween. As shown here, the springs 100 are arcuate members, however other shapes may be possible, e.g., semi-circular sections, helicoids, etc. The springs 100 may be coated with an oxidation resistant metal, e.g., gold.

A release layer 108 is shown formed over the substrate 102. The release layer 108 can be a metal (e.g., Ti, an alloy of Ti) that electrically conducts between the metal contact 104 and the springs 100. In other embodiments, the release layer can be an insulator, e.g., $Si_xO_yN_z$, where x, y, and z are fractional constituents ranging from 0 to 1. The release layer 108 may also be a non-metal (e.g., SixOyNz, where x, y, and z are fractional constituents less than or equal to 1), and additional features (e.g., metallic vias) may be formed to electrically couple the springs 100 to the metal contact 104. The release layer 108 has a number of functions. First, the release layer 108 anchors a first end 100*a* of the springs to the substrate 102. Second, the release layer 108 can be undercut etched without etching or otherwise damaging the springs 100, allowing the springs 100 to deform out-of-plane as seen in the figure.

In embodiments described below, a layer of the stress-engineered material is formed over the release layer 108. The layer of stress-engineered material is patterned and etched to form the outline shape of the springs 100. Then the release layer material in region 110 is undercut etched, releasing ends 100*b* from the layer 108 and allowing them to deform as shown. Note that the release layer 108 may cover a large number of metal contacts similar to 104, and if formed of a conductive material, would short the pads if the release layer 108 was left covering all of them. Therefore, a final etching may be performed on the release layer 108 following this stage, where only a portion of the release layer 108 will remain in place over the metal contact 104 in order to continue anchoring the springs 100.

Electronic devices can benefit from the addition of micro-spring contacts 100 on their surfaces, allowing the devices to be easily assembled into compact, multi-chip modules. For example, electronic interconnects utilizing micro-springs 100 involve compressing springs fabricated on one chip against contact pads made on another chip. In many applications, a built-in spacer 112 is used that defines the gap between assembled chips and that determines the level of spring compression in the interconnects. Note that the illustrated spacer 112 is not to scale, and may be larger and located further from the springs 100 than shown. Further, multiple such spacers 112 may be deployed so as to provide stable mechanical support for the mating chip. Due to the thickness of spacers 112, it may not be practical to form them using typical wafer fabrication processes (e.g., sputtering). Thus, suitable candidate materials for forming the spacer 112 are often photo-definable organic spin-on polymers.

Figure 2:
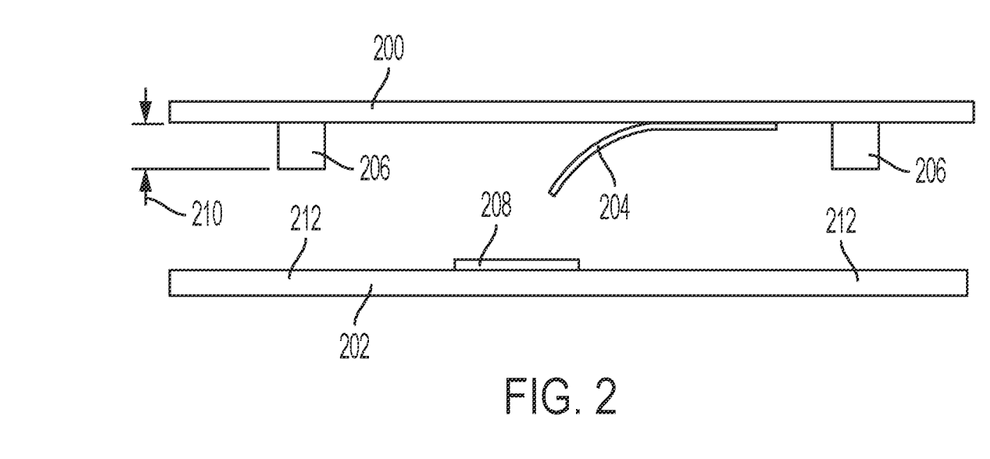
FIGS. 2 and 3 are side views showing two chips being aligned and assembled together according to an example embodiment.
Figure 3:
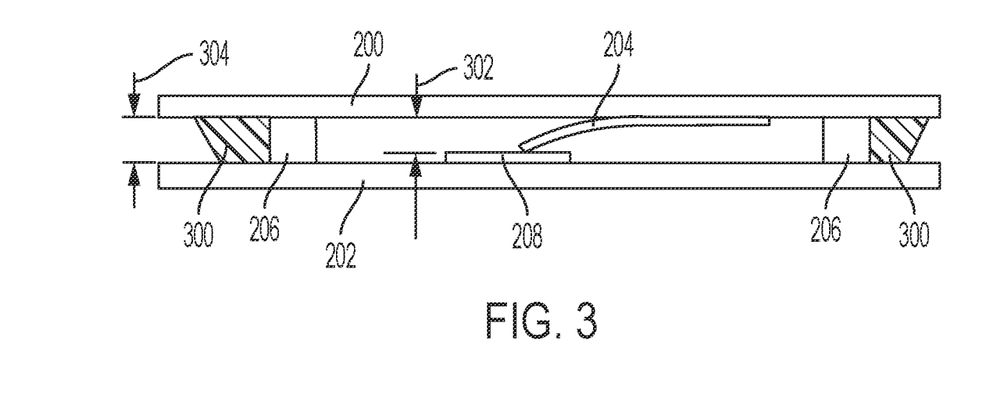

In FIGS. 2 and 3, side views show an illustration of two chips 200, 202 being aligned (FIG. 2) and assembled (FIG. 3) together to form an electronic assembly, e.g., a multi-chip module package. The spring chip 200 has a micro-spring 204 formed on its substrate, and the pad chip 202 has a contact pad 208 formed on its substrate. Once assembled, the micro-spring 204 establishes an electrical connection with the contact pad 208, and the resulting interconnects allow the two chips 200, 202 to communicate. In prior implementations, spacers were formed on the pad chip 202, however in this implementation, spacers 206 are formed on the spring chip 200. The spacers 206 have a thickness 210 that causes a predetermined compression of the micro-spring 204. When an interface surface 212 of the pad chip 202 contacts the spacers 206, the micro-spring is compressed to the compressed dimension 302 as shown in FIG. 3. Note that the contact surface 212 may be at a perimeter of the pad chip 202, and may also include regions inside the pad chip 202, e.g., in an internal region without any micro-springs. The spacers 206 cause a gap 304 to be formed between the pad chip 202 and the spring chip 200.

Note that the compressed dimension 302 may be different than the spacer thickness 210 due to thicknesses of the micro-spring 204, contact pad 208, features on the interface surface 212, etc. Nonetheless, there will be a correspondence between the spacer thickness 210 and the compressed dimension 302 that can be readily derived through a geometry and tolerance analysis. In some embodiments, the spacer thickness is 3 μm or more, and the micro-spring 204 may extend a slightly more. As seen in FIG. 3, the area surrounding the spacers 206 may be covered with an adhesive or underfill 300 after assembly. The underfill is on an edge of the spacers 206 that faces away from the micro-spring 204 and contact pad 208. The spacers 206 may have features (e.g., full seal, selectively sized openings) to prevent the underfill 300 from coming into contact with the micro-spring 204 and pad 208.

Spacers were previously formed on the pad chips because this surface did not require significant processing (e.g., deposition, etching) after forming the spacers. Forming the spacers on the spring chip 200 is more challenging because the spacers 206 will be fabricated as an integral part of a micro-machining process used to form the three-dimensional spring structures. Nonetheless, the ability to form spacers 206 on the spring chip 200 can be advantageous because, in some multi-chip module package applications, the springs 204 and the spacers 206 can be made on a custom interposer platform. The pad chips 202, on the other hand, may include small singulated dies that do not easily accommodate the fabrication processes for incorporating spacers.

Figure 4:
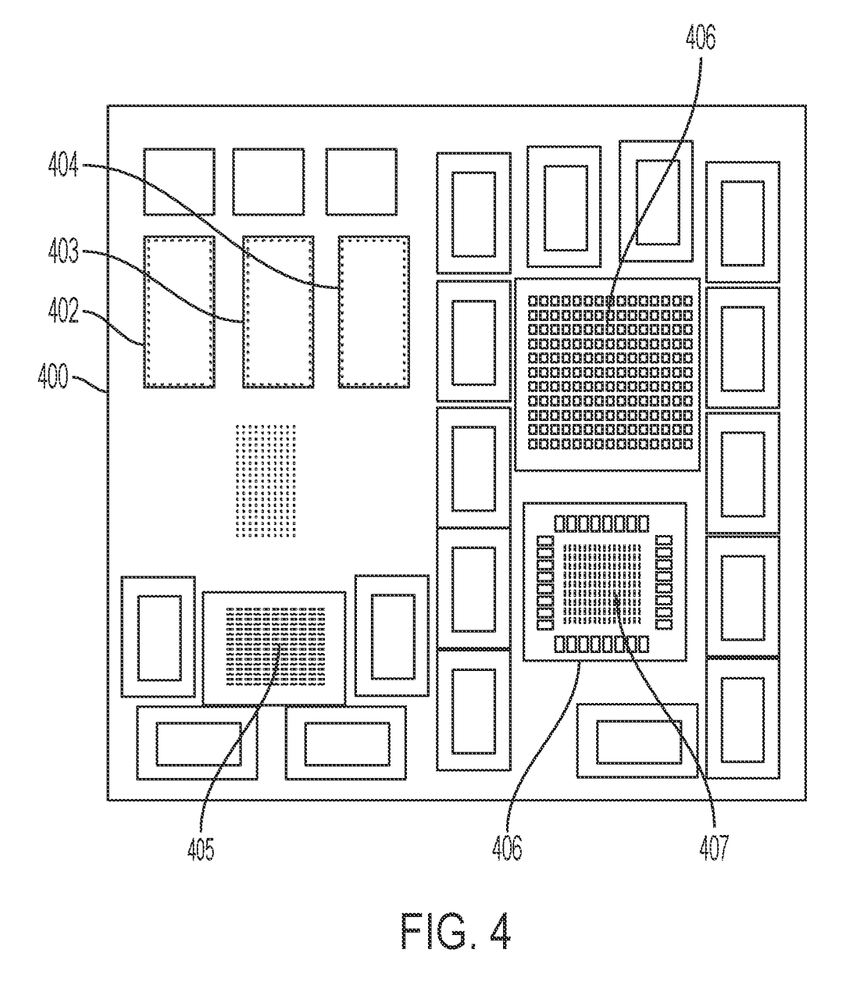
FIG. 4 is a plan view showing an interposer integrated circuit according to an example embodiment.

In FIG. 4, a plan view shows an interposer integrated circuit 400 according to an example embodiment. The interposer 400 is configured to hold a large number of pad chips in a multi-chip module package. The chip locations are marked with rectangular outlines, and arrays within the outlines indicate arrays of micro-springs. A subset of the pad chips interconnect with the interposer via micro-springs at locations 402-407. The springs and spacers for these locations 402-407 can be fabricated on the interposer 400 as an add-on wafer-scale custom process described in further detail below.

One challenge addressed in this disclosure is the ability to integrate the fabrication process of the spacers with that of micro-springs so the two structures can be co-fabricated together in a compatible manner. Another challenge addressed is achieving sufficient spacer adhesion, so that long and narrow spacer structures do not delaminate during fabrication. A third challenge is identifying a suitable spacer material that can be processed at a sufficiently low temperature so as to not damage the underlying integrated circuit components.

Figure 5:
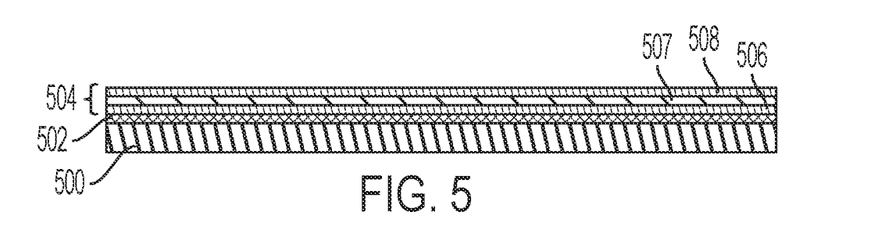
FIGS. 5-8 are side views showing a fabrication sequence according to an example embodiment.

One approach involves depositing the micro-spring metal stack on a release layer, etching away the gold and stress-engineered portions of the stack in regions where the spacer layers are designed to go, forming the spacer layer, and releasing the out-of-plane portion of the springs via undercut etching. In FIGS. 5-8, side views show a fabrication sequence according to an example embodiment. As seen in FIG. 5, a release layer 502, e.g., Ti or an alloy thereof, is first blanket deposited on the surface of the substrate 500. Next, multilayer structure 504 used to form the springs. In this example, the multilayer structure is a first gold layer 506, followed by a stress-engineered film 507, such as a MoCr alloy, which is followed by another gold layer 508. Note that the stress-engineered film 507 may itself be a multilayer structure. The sandwich of gold layers 506, 508 protects the stress-engineered film 507 from subsequent processing chemicals, increases electrical conductivity, and allows subsequent electroplating of additional metals such as copper.

Figure 6:
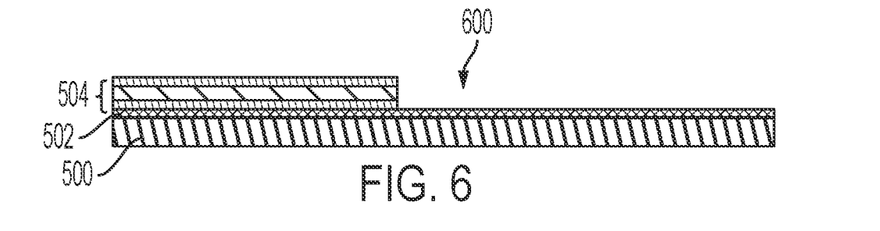
Figure 7:
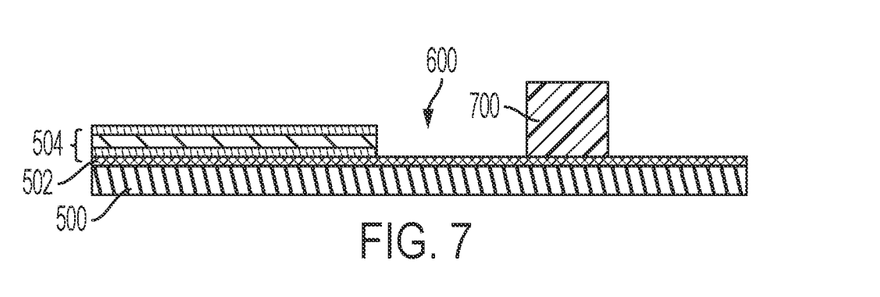
Figure 8:
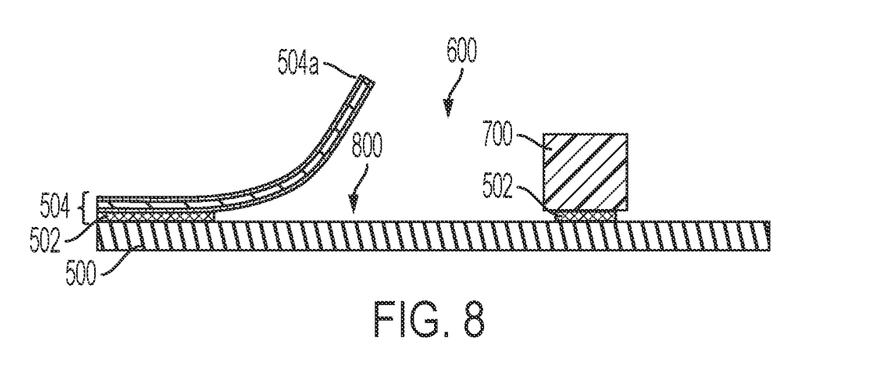

As seen in FIG. 6, openings 600 are then etched on the multilayer structure 504 down to the release layer 502. These openings are formed as part of the process for pattern the multilayer structure 504 to define spring structures. A spacer layer material is spin-coated onto the wafer. As seen in FIG. 7, the spacer layer material is patterned to form spacers 700 within the openings 600. The spacer layer material is may be a polymer such as polyimide, SU8, benzocyclobutene (BCB), etc., that can be patterned either by etching or by direct photolithography definition. As seen in FIG. 8, the release layer 502 is next patterned and undercut etched, and the built-in stress within the stress-engineered film 507 raises released portions 504a of the multilayer structure 504 out of the substrate plane.

The spacer 700 is designed with a large enough footprint (projection onto the substrate plane) so it does not lift off when its underlying layer is undercut etched during the spring release step. Residual release layer materials can then be removed from the rest of the wafer surface via a blanket chemical etch. Note that in some embodiments, the portion of the release layer 502 below the spacer 700 can be removed before the spacer material is spin coated, such that that spacer 700 is formed directly on the substrate 500.

Figure 9:
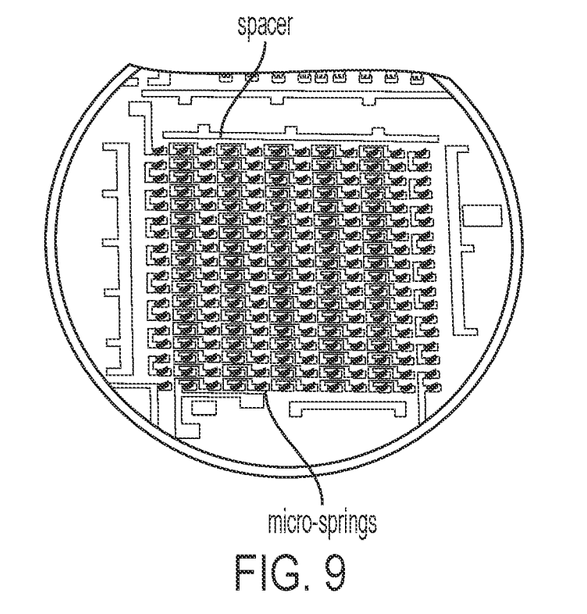
FIG. 9 is a scanning electron micrograph image showing micro-springs with integrated spacers co-fabricated on an integrated circuit chip in accordance with the an example embodiment.

The process described above has been successfully demonstrated in the lab by co-fabricated spacers and springs on different substrates (such as glass, silicon, gold-coated silicon), including on pre-processed integrated circuit wafers. In FIG. 9, a scanning electron micrograph image shows micro-springs with integrated spacers co-fabricated on an integrated circuit chip in accordance with the described embodiment. The integrated circuit shown in FIG. 9 contains superconducting niobium electrical lines that degrade in performance if exposed to temperatures above 150° C. For this reason, a photo-definable SU8 was chosen as the spacer material because SU8 can be cured at temperatures below 200° C. Processing methods including limiting exposure times to developing chemicals during patterning were used that further reduced the required curing temperature to 150° C. To achieve this, the SU8 spacer was patterned by direct photolithography and then cured at 150° C. for one hour in a vacuum oven.

Subsequent micro-spring processing steps may require exposing the spacer to photoresist stripper chemicals, e.g., hydrofluoric acid. It has been found that the curing process is sufficient to make the spacer withstand these chemicals if the chemical exposure is kept below 5 minutes. Therefore, the subsequent photoresist processing steps, such as post-coat baking temperature and duration, were designed so the photoresist can be removed with stripper chemicals in less than 5 minutes. The materials and processing method choices kept the entire processing sequence to below 150° C., preventing damage to the wafer.

Figure 10:
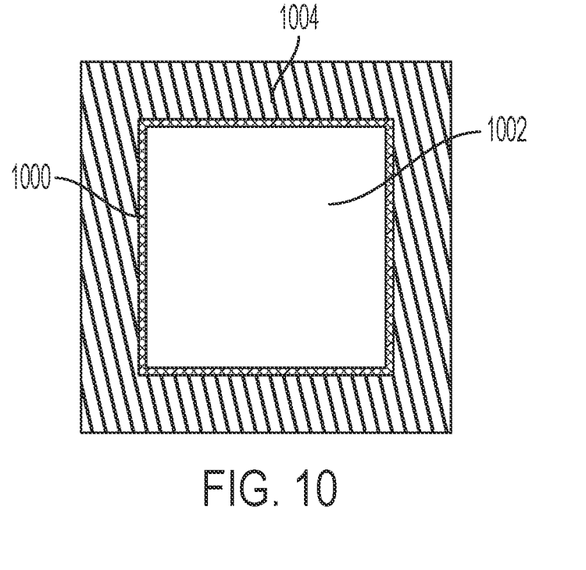
FIG. 10 is a plan view showing a spacer according to an example.

In FIG. 10, a plan view shows a spacer 1000 according to an example embodiment. In this embodiment, a single spacer 1002 completely surrounds a spring interconnect region 1002. When the spring chip and pad chip are assembled into a package, the spacer 1000 functions as a wall that blocks adhesives or underfills 1004 from reaching and disturbing the interconnect area. In some embodiments, a spacer is designed to have some openings to allow for vents, while still blocking adhesives or underfills applied at select localized regions around the assembly.

The shape of the spacer may contain long and narrow features because the spacer is designed to be pressed against a mating pad chip and therefore follows the perimeter outline of that chip. Generally, perimeter outline area on the chip may be kept small in order to maximize the number of chips per wafer, and the chip-to-chip distances may also be small in order to maximize component density. This can result in long and narrow spacers. Long and narrow structures that ran across macroscopic scales are challenging to fabricate. They tend to delaminate, especially when subjected to high mechanical forces such as during chip assembly.

Figure 11:
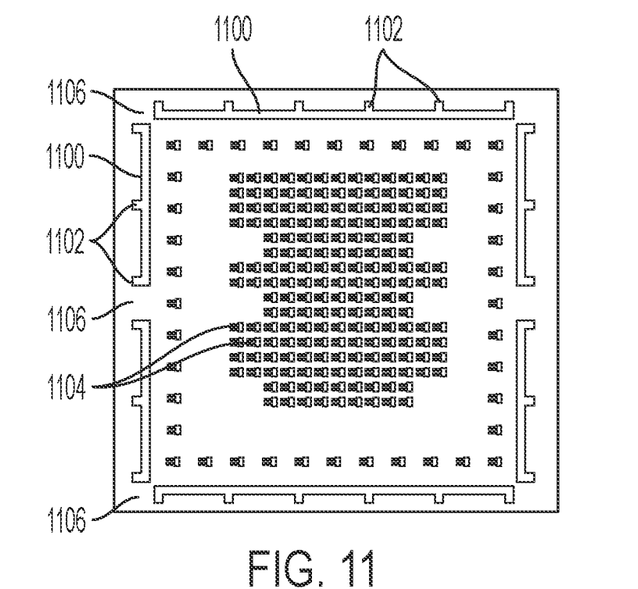
FIGS. 11 and 12 are plan views of spacer structures according to other example embodiments.
Figure 12:
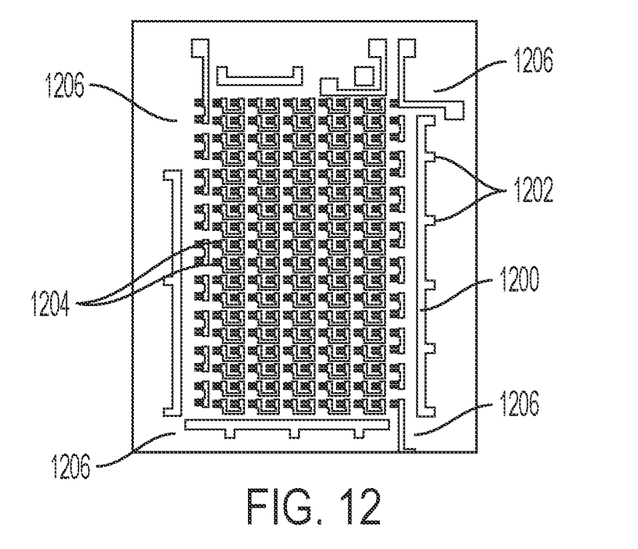

This issue can be addressed by incorporating tabs along the lengths of the spacer. These tabs function as anchors and promote adhesion. In FIGS. 11 and 12, plan views show two examples of spacers having elongated main structures 1100, 1200 featuring tab anchors 1102, 1202 extending from the main structures 1100, 1200 at a right angle. The main structures 1100, 1200 and tab anchors 1102, 1202 are co-fabricated with micro-springs 1104, 1204, e.g., on a gold-coated wafer substrate. Generally, the tabs 1102, 1202 are regularly spaced along the main structures 1100, 1200, facing outward from the micro-springs 1104, 1204 and having a thickness approximately equal to that of the main structures 1100, 1200. The tabs 1102, 1202 could have different shapes than shown (e.g., rounded protrusions), and could extend inward if there is sufficient clearance.

In these examples, openings 1106, 1206 exist between the main structures 1100, 1200, although in other embodiments spacers can fully enclose the micro-springs. The openings 1106, 1206 allow air to be evacuated from a volume created by the spacers, the substrate, and a mating chip that is placed over the main structures 1100, 1200 and micro-springs 1104, 1204. The openings 1106, 1206 can be sized such that, given factors such as the viscosity of the underfill, hardening time of the underfill, separation between the main structures 1100, 1200 and micro-springs 1104, 1204, etc., a flow of the underfill though the openings 1106, 1206 is minimized and will not reach the electrical contacts enclosed in the volume.

Figure 13:
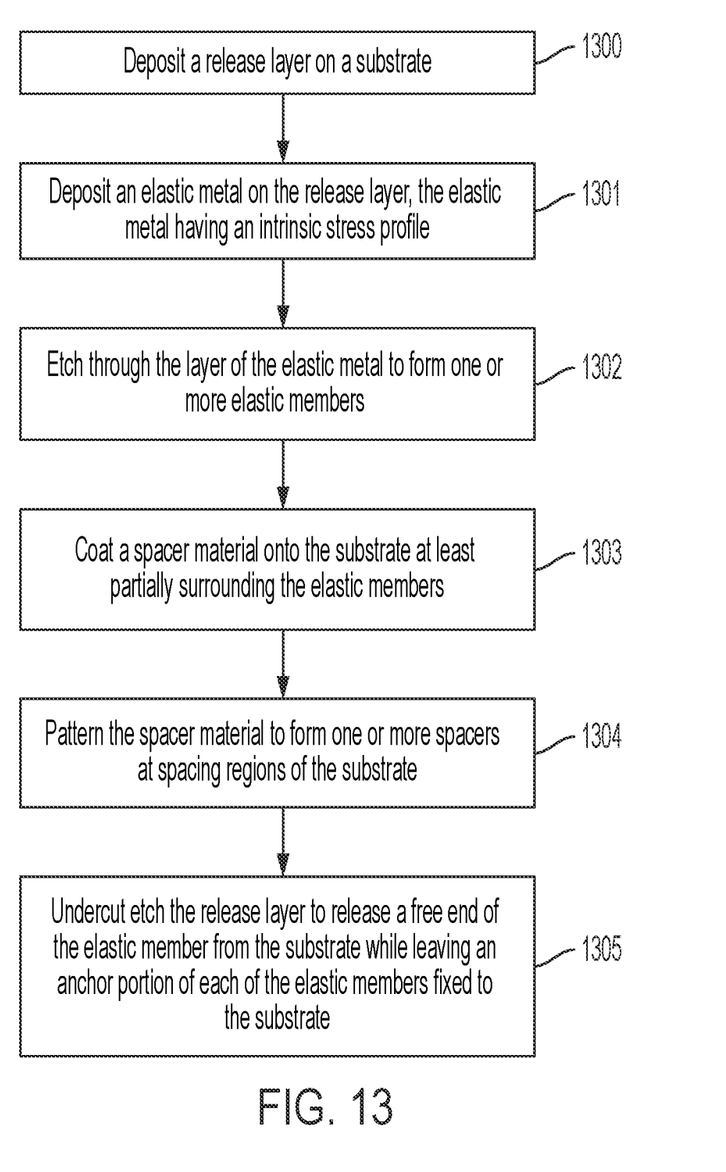
FIG. 13 is a flowchart of a method according to an example embodiment.

In FIG. 13, a flowchart illustrates a method according to an example embodiment. The method involves depositing 1300 a release layer on a substrate and depositing 1301 an elastic metal on the release layer. The elastic metal having an intrinsic stress profile that causes it to curl or bend if not constrained. The layer of the elastic metal is etched 1302 to form one or more elastic members. Note that at this stage, the elastic members are still planar. A spacer material is coated 1303 onto the substrate. The spacer material is patterned 1304 to form one or more spacers at least partially surrounding the elastic members. The release layer is undercut etched 1305 to release a free end of the elastic member from the substrate while leaving an anchor portion of each of the elastic members fixed to the substrate. The intrinsic stress profile in the elastic member biases the free end of the elastic member away from the substrate to form an out of plane structure upon release of the free end.

In some embodiments, an additional step is included after step 1305, where all uncovered release layer material is removed. In other embodiments, the release layer where the spacer goes is removed prior to step 1303.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method comprising:
   depositing a release layer on a substrate;
   depositing an elastic metal on the release layer, the elastic metal having an intrinsic stress profile;
   etching through the layer of the elastic metal to form one or more elastic members;
   coating a spacer material onto the substrate;
   patterning the spacer material to form one or more spacers at least partially surrounding the elastic members, wherein the one or more spacers comprise:
      a main structure elongated along a first direction; and
      tabs extending from the main structure at an angle to the first direction, the tabs preventing delamination of the main structure; and
   undercut etching the release layer to release a free end of the elastic member from the substrate while leaving an anchor portion of each of the elastic members fixed to the substrate, the intrinsic stress profile in the elastic member biasing the free end of the elastic member away from the substrate to form an out of plane structure upon release of the free end.

2. The method of claim 1, wherein the spacer material is coated above the release layer and wherein portions of the release layer underneath the patterned spacer material remains after undercut etching.

3. The method of claim 1, wherein the release layer at a region on which the one or more spacers are to be formed is removed prior to applying the spacer material.

4. The method of claim 1, wherein the elastic metal comprises a MoCr alloy.

5. The method of claim 1, wherein the spacer material comprises a polymer.

6. The method of claim 5, wherein the polymer comprises at least one of polyimide, SU8, or benzocyclobutene.

7. The method of claim 5, further comprising curing the polymer at a temperature of 150 degrees C. or less.

8. The method of claim 1, wherein the release layer comprises Ti, an alloy of Ti, or, $Si_xO_yN_z$, where x, y, and z are fractional constituents ranging from 0 to 1.

9. The method of claim 1, further comprising assembling the substrate to a chip such that the one or more spacers contact a surface of the chip, the assembly causing the out of plane structures to touch corresponding contact pads on the chip, the one or more spacers having a thickness that results in a predetermined compression of the out of plane structures.

10. The method of claim 9, further comprising applying an underfill to flow into a gap between the chip and the substrate such that placement of the spacers prevents the underfill from reaching the contact pads.

11. The method of claim 10, wherein the one or more spacers partially surround the one or more contact pads in an arrangement with openings, the openings allowing for evacuation of air in a contact pad region.

12. The method of claim 1, wherein the substrate comprises superconducting circuits or low temperature electronics.

13. The method of claim 1, wherein a thickness of the spacer is 3 μm or more.

14. The method of claim 1, wherein the elastic members are arranged in a two-dimensional, areal array.

15. A method comprising:
   depositing a release layer on a substrate, wherein the substrate comprises superconducting circuits or low temperature electronics that are subject to damage at maximum processing temperatures at or above 150° C., wherein the method is performed at a processing temperature below 150° C.;
   depositing an elastic metal on the release layer, the elastic metal having an intrinsic stress profile;
   etching through the layer of the elastic metal to form one or more elastic members;
   coating a spacer material onto the substrate;
   patterning the spacer material to form one or more spacers at least partially surrounding the elastic members, wherein the one or more spacers comprise:
      a main structure elongated along a first direction; and
      tabs extending from the main structure at an angle to the first direction, the tabs preventing delamination of the main structure; and
   undercut etching the release layer to release a free end of the elastic member from the substrate while leaving an anchor portion of each of the elastic members fixed to the substrate, the intrinsic stress profile in the elastic member biasing the free end of the elastic member away from the substrate to form an out of plane structure upon release of the free end.

16. The method of claim 15, wherein the substrate comprises the superconducting circuits, and wherein the superconducting circuits remain functional below 77 Kelvin.

17. The method of claim 15, wherein the spacer material comprises a polymer, the method further comprising curing the polymer at the processing temperature below 150° C.

* * * * *